(12) United States Patent
Hunt, Jr.

(10) Patent No.: US 9,536,174 B2
(45) Date of Patent: Jan. 3, 2017

(54) FAULT-AWARE MATCHED FILTER AND OPTICAL FLOW

(71) Applicant: Prioria Robotics, Inc., Gainesville, FL (US)

(72) Inventor: Walter Lee Hunt, Jr., Gainesville, FL (US)

(73) Assignee: Prioria Robotics, Inc., Gainesville, FL (US)

( * ) Notice: Subject to any disclaimer, the term of this patent is extended or adjusted under 35 U.S.C. 154(b) by 0 days.

(21) Appl. No.: 14/640,789

(22) Filed: Mar. 6, 2015

(65) Prior Publication Data

US 2015/0186750 A1    Jul. 2, 2015
US 2016/0247041 A2    Aug. 25, 2016

Related U.S. Application Data

(62) Division of application No. 12/789,144, filed on May 27, 2010, now Pat. No. 8,977,665.

(60) Provisional application No. 61/182,098, filed on May 28, 2009, provisional application No. 61/181,664, filed on May 27, 2009.

(51) Int. Cl.
| | |
|---|---|
| *G06K 9/64* | (2006.01) |
| *G06K 9/62* | (2006.01) |
| *G06T 7/20* | (2006.01) |
| *H03H 17/02* | (2006.01) |
| *G06K 9/03* | (2006.01) |

(52) U.S. Cl.
CPC .............. *G06K 9/6201* (2013.01); *G06K 9/03* (2013.01); *G06T 7/20* (2013.01); *H03H 17/0248* (2013.01); *G06T 2207/10016* (2013.01); *H03H 17/0254* (2013.01)

(58) Field of Classification Search
CPC .......... G06K 9/6201; G06K 9/03; G06T 7/20; H03H 17/0248; H03H 17/02
USPC ....................................................... 382/217
See application file for complete search history.

(56) References Cited

U.S. PATENT DOCUMENTS

2002/0148961 A1* 10/2002 Nakasuji .............. G01N 23/225
                                                                 250/311
2004/0170326 A1* 9/2004 Kataoka ................ G06T 7/0044
                                                             382/209

* cited by examiner

*Primary Examiner* — Ruiping Li
(74) *Attorney, Agent, or Firm* — Robert Plotkin, P.C.; Robert Plotkin, Esq.

(57) ABSTRACT

In one embodiment, a fault-aware matched filter augments the output of a component matched filter to provide both fault-aware matched filter output and a measure of confidence in the accuracy of the fault-aware matched filter output. In another embodiment, an optical flow engine derives, from a plurality of images, both optical flow output and a measure of confidence in the optical flow output. The measure of confidence may be derived using a fault-aware matched filter.

30 Claims, 13 Drawing Sheets

FAULT-AWARE MATCHED FILTER AND OPTICAL FLOW

BACKGROUND

A traditional matched filter correlates a known signal or function (the "template" or "reference") with an unknown signal in the presence of noise to detect and select (match) the presence of the unknown signal from the reference set. One common application of matched filters is in radar systems, in which a known signal is transmitted, and in which the reflected signal received by the radar system is matched against the originally-transmitted known signal.

The concept of matched filters was first introduced by North in 1943 to increase the signal-to-noise ratio (SNR) in early telecommunications applications, although the modern name wasn't used until a 1960 paper by Turin. The current state-of-the-art, Principe's correntropy matched filter, is a nonlinear extension to the classical matched filter (International Patent WO 2007/027839 A2).

Traditional matched filters typically produce a numeric output that describes the similarity between the reference and the unknown signal. Often, a threshold function is applied to this numeric output such that the final result represents a "match/no-match" result for the comparison.

One common application of the matched filter in the area of machine vision is for the computation of optical flow. Optical flow (OF) is a measurement of the apparent velocities of brightness patterns between images in a sequence (Horn and Schunck 1981). The most common type of input image sequence in embedded "machine vision" applications is a sequence of time-ordered frames from live or recorded video. Optical flow in an image sequence results from changes in camera pose or changes in the environment, such as the motion of an object in the scene, or dynamically varying lighting conditions. The traditional output of the OF algorithm is a vector field showing the magnitude and direction of the optical flow of the input image sequence. In general, the vector field consists of one or more vectors representing the flow measured at locations within the input data coordinate space. Individual flow vectors can have one or more dimensions, depending on the input data. For optical flow measurements of an image sequence sourced from live video, the origin of the vector indicates the position of the OF sample (i.e. measurement) in the source image space, and the magnitude/direction of the vector provides the magnitude and displacement of the optical flow field at the sample position.

Many classification systems for classes of optical flow algorithm exist. One widely accepted approach divides OF algorithms into five classes (Beauchemin and Barron 1995): intensity-based differential methods, correlation-based methods, frequency-based differential methods, multiple motion methods, and temporal refinement methods. Alternately, OF algorithms can be classified as "classical" or "real-time" to differentiate according to the speed at which the data is processed. In the latter classification scheme, "real-time" implies that processing occurs as the images are input to the system, and that the processing output is made available after some short processing delay. Furthermore, the application will provide a constraint on the maximum allowed delay between data input and optical flow output. By contrast, a "classical" optical flow algorithm has no time constraint for the processing. Short times are always better, but long times are acceptable if justified by performance. This alternate classification scheme is most frequently used when dealing with real-time embedded applications; for these apps, only real-time OF algorithms are of any use. Although "real-time" sometimes is defined as being ~30 Hz (due to influence from traditional video frame rates), there is no single agreed-upon quantitative definition for the term "real-time."

The most famous optical flow algorithm is the KLT feature tracker, which was originally described in the work of Lucas and Kanade (Lucas and Kanade 1981) and fully developed by Tomasi and Kanade (Tomasi and Kanade 1991). Historically, a key problem in the computation of flow is the identification of reliable features to track. This problem is addressed in a classical work by Shi and Tomasi (Shi and Tomasi 1994), where metrics were developed to identify "good features to track", which were regions of the image that were likely to be suitable for making a reliable optical flow measurement. Additionally, Shi and Tomasi 1994 presented an affine motion model for the motion of the features within an image, which provided improved performance compared to the simpler translational model. The KLT feature tracker is well understood by optical flow experts. It is traditionally classified as a classical OF algorithm, but it can be implemented in real-time for some applications using modern embedded hardware, with reasonably good performance. Since it is well understood and since optical flow algorithms also contain matched filters, KLT will be used herein as an OF algorithm baseline for comparison to embodiments of the inventive methods.

A mission- or safety-critical system is one where correct and safe operation of a signal processing subsystem strongly influences the performance/behavior of the system as a whole. For safety-critical subsystems, the performance of the system is directly related to human safety. Modern real-time mission- and safety-critical systems must impose application-specific requirements on underlying signal processing sub-components in order to ensure that the algorithms meet the needs of the system. Unfortunately, challenging or harsh signal processing environments are common in extreme applications, and these can lead to algorithm behavior that violates the design specification. This out-of-spec behavior is called a "signal processing fault" when it occurs in signal processing algorithms like the matched filter or optical flow.

Signal processing faults are a significant problem for small form-factor mission- or safety-critical embedded systems. Faults that occur in low-level signal processing layers in this type of system have increased likelihood to induce faults in higher-level signal processing, eventually leading to the failure of the system as a whole. In a safety-critical system, such failures can lead to property damage, injury, and even death. Unfortunately, the size, weight, and power consumption restrictions typically imposed on small form-factor embedded electronics impose severe limits on the fault detection methods that can be used.

SUMMARY

Currently, state-of-the-art matched filters are capable of generating fault warning outputs along with their matched filter output. These fault warnings assess the correctness or accuracy of the matched filter output such that a consumer of that output can elect to ignore the output or take fault-correction steps when a fault state is indicated. However, as will be shown in the Detailed Description section, the fault warnings produced by conventional matched filters are derived from the same filter data set that was used to create the matched filter output. As a result, the matched filter output and the fault warning output share substantially similar failure modes, such that an external event capable of inducing a fault condition in the matched filter output has a significantly increased probability of also inducing a fault condition in the fault warning output. In other words, an event capable of breaking the filter has an increased chance of breaking all of the outputs, including the fault warnings.

This is a serious problem for a filter that is part of a mission- or safety-critical system. In these systems, undetected faults can cause property damage and/or death if they propagate through the system unchecked. As a result, such systems require expensive processing without access to the inner workings of the filter to independently detect scenarios of increased risk so mitigation steps can be taken. However, systems operating at the cutting edge of technology, in challenging environments, or those with a wide range of operating conditions often do not have the excess processing capacity to support the overhead of "detecting faults in the fault-detection".

Embodiments of the present invention include a fault-aware matched filter which augments an underlying matched filter to derive and output "confidence estimate outputs". The confidence estimate outputs of the fault aware-matched filter are derived in a manner such that they are guaranteed to have substantially different failure modes than the underlying matched filter output. In this way, fault-aware matched filters implemented according to embodiments of the present invention possess a significantly higher probability of correctly detecting a fault in the matched filter output compared to the un-augmented "legacy" (underlying) filter. The quantitative definition of "significantly higher probability" is dependant on the application in question (and the application's tolerance for risk). However, a good guideline is that the phrase implies an order of magnitude or more of improvement in the rate of undetected output matched filter output faults.

For example, one embodiment of the present invention is a method (such as a computer-implemented method) comprising: (A) applying a first filter to a data vector and a set R, the set R containing at least one reference vector, to produce first filter output representing a measure of similarity of the data vector to at least one reference vector in the set R; (B) applying a second filter to second filter inputs to produce second filter output, wherein the first filter has at least one failure mode not shared by the second filter; (C) deriving, from the first filter output and the second filter output, confidence estimate output representing a degree of confidence in the correctness of the first filter output. Other embodiments of the present invention include devices and systems having components adapted to perform this method.

Optical flow algorithms are consumers of matched filter output such that each optical flow sample is produced by a matched filter. Because the measurement of optical flow is inherently error prone, these algorithms have adapted to consume both the matched filter and fault warning outputs for each flow sample. Any flow sample associated with asserted fault warning outputs from the originating matched filter is discarded by the optical flow algorithm. Undetected matched filter output faults manifest in the optical flow field as "outliers" or "flow sample faults". These flow sample faults are essentially "wrong-way" vectors which incorrectly report the optical flow at a region within the image. If enough undetected flow sample faults collect in the optical flow output then the optical flow algorithm's output can go out of its operating specification. When the optical flow output is out-of-specification, an "optical flow fault" or "flow-field fault" is said to have occurred. Optical flow faults due to undetected flow sample faults are very difficult to detect reliably after-the-fact with any form of post-processing in "real-world" environments. When they occur, the optical flow algorithm's output consumer is at increased risk of failure. In the worst case scenario, the fault would continue to propagate to subsequent output consumers and cause the entire system to fail.

An important observation is that flow sample faults (detected or undetected) are not the only ways to cause an optical flow fault. Optical flow faults can occur any time the flow field output is out-of-spec, and the output specification can have (application-specific) requirements other than those related to individual flow samples. For example, an optical flow algorithm might be required to output more than some critical number of samples. Alternately, the flow-field density in a specified region-of-interest might be part of the output specification. In the presence of requirements such as these, it is possible that all flow samples are valid, yet the flow field itself is invalid. When application-specific requirements are considered, it is clear that a need exists for fault detection in optical flow beyond that provided by simple filtering of the flow field by individual matched filter fault warnings, as is done by the current optical flow state-of-the-art.

Embodiments of the present invention for fault-aware optical flow include embodiments which generate optical flow confidence estimate outputs that are similar to the confidence estimate outputs of matched filters implemented according to embodiments of the present invention, in that the fault-aware optical flow confidence estimate outputs assess the "correctness" of the optical flow output relative to an application-specific output specification. One such embodiment utilizes one-or-more fault-aware matched filters to generate the optical flow vector field. Another such embodiment utilizes one-or-more unspecified fault-aware matched filters to generate the flow field and augments the traditional optical flow output set with an optical flow confidence estimate output. Yet another embodiment utilizes one-or-more unspecified matched filters to generate the flow field and augments the traditional optical flow output set with an optical flow confidence estimate output. In this embodiment, no fault-aware matched filters are present. Yet another embodiment utilizes supplemental sensor inputs as an estimation tool and as a fault-detection mechanism.

Embodiments of the present invention also include novel techniques for generating optical flow, referred to herein as correntropy optical flow and fault-aware correntropy optical flow (where the latter is an embodiment of the inventive methods for correntropy optical flow, augmented by an embodiment of inventive methods for fault-aware optical flow).

For example, one embodiment of the present invention is a method (such as a computer-implemented method) comprising: (A) receiving a first image input in an image input sequence; (B) receiving a second image input in the image input sequence, wherein the second image input has a relative position subsequent to the first image input in the image input sequence; (C) applying a frame sample filter to the first image input to produce a sample pattern comprising at least one sample; (D) applying a sample registration filter to the second image input and the sample pattern to identify: (D)(1) an unfiltered flow sample set comprising at least one optical flow sample, wherein the unfiltered flow sample set defines a coregistration between the first image input and the second image input; (D)(2) at least one fault warning representing a degree of confidence in the coregistration; (E) removing, from the unfiltered flow sample set, at least one sample specified by the at least one fault warning as in-fault, to produce a filtered flow sample set; and (F) generating optical flow confidence estimate output based on the filtered flow sample set. Other embodiments of the present invention include devices and systems having components adapted to perform this method.

Yet another embodiment of the present invention is a method (such as a computer-implemented method) comprising: (A) receiving a first image input in an image input sequence; (B) receiving a second image input in the image input sequence, wherein the second image input has a relative position subsequent to the first image input in the image input sequence; (C) applying a frame sample filter, including a first matched filter, to the first image input to produce a sample pattern comprising at least one sample; (D) applying a sample registration filter, including a second matched filter, to the second image input and the sample pattern to identify: (D)(1) an unfiltered flow sample set comprising at least one optical flow sample, wherein the unfiltered flow sample set defines a coregistration between the first image input and the second image input; and (D)(2) at least one fault warning representing a degree of confidence in the coregistration; and (E) removing, from the unfiltered flow sample set, at least one sample specified by the at least one fault warning as in-fault, to produce a filtered flow sample set. Other embodiments of the present invention include devices and systems having components adapted to perform this method.

Other features and advantages of various aspects and embodiments of the present invention will become apparent from the following description and from the claims.

DETAILED DESCRIPTION

Embodiments of the present invention include methods and systems which can provide a significant improvement in fault-detection capability when compared to the current state-of-the-art for each respective method/system. A method or system that implements an embodiment of a matched filter according to the present invention is referred to herein as a "fault-aware matched filter." An optical flow method or system that implements embodiments of the present invention is referred to herein as a "fault-aware optical flow" method or system.

The term "fault-aware" is used herein to refer to inventive embodiments for the detection of signal processing faults for a matched filter or optical flow. Embodiments of the fault-aware matched filter and fault-aware optical flow disclosed herein may be used as augmentations to traditional matched filters or optical flow techniques. For example, when embodiments of the present invention are used to augment a correntropy matched filter, the result is a fault-aware correntropy matched filter.

Figure 1:
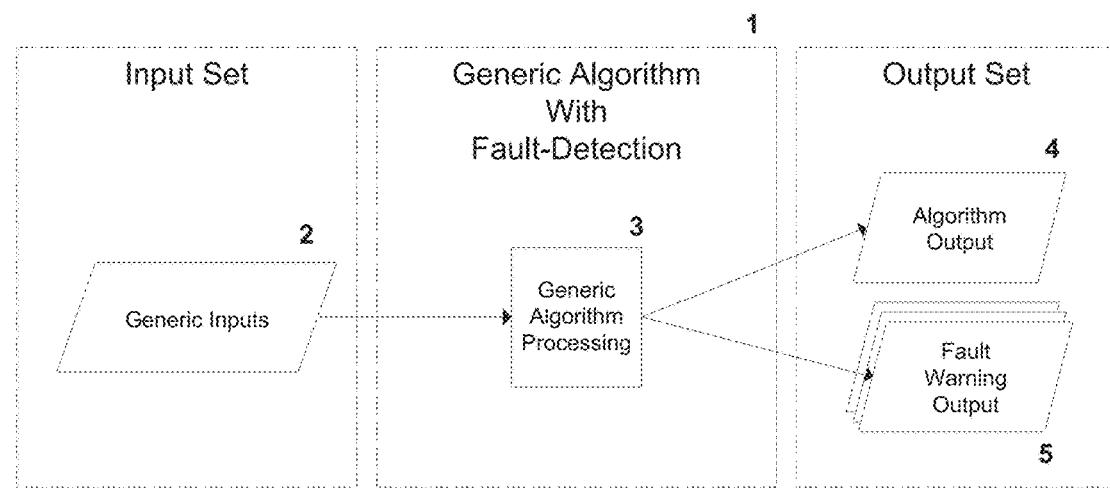
FIG. 1 is a data flow diagram for an embodiment of a generic algorithm with built-in fault detection. The diagram is intended for the purpose of explaining the nature of fault-detection capability, and is not a representation of any specific algorithm or algorithm class.

Many conventional algorithms with built-in fault detection exist. FIG. 1 shows a generic data flow diagram for an algorithm with built-in fault detection. In FIG. 1, the generic algorithm 1 has a set of inputs 2 and some output 4 that will be used as an input by the generic algorithm's output consumer. In addition, a set of fault-warnings 5 is present as an extra output. The internal processing 3 of the generic algorithm 1 is responsible for generating both the output and fault warnings 5.

The term "confidence estimates" as used herein describes fault warnings with special properties related to embodiments of the invention. A distinguishing characteristic of embodiments of the present invention is that the confidence estimates for a fault-aware matched filter or fault-aware optical flow embodiment are derived such that the algorithm output and the failure modes for the confidence estimates do not significantly overlap. Additionally, embodiments of the fault-aware matched filter and fault-aware optical flow algorithms may be capable of utilizing inputs from supplemental sensors to improve the reliability of both the output and the confidence estimates. For innovative embodiments that elect to support supplemental sensors, these sensors may be required or they may be supported on an as-available basis. However, supplemental sensor inputs are not a requirement of the present invention.

Confidence estimates produced by embodiments of the present invention may, for example, include Boolean and/or numeric values. Boolean confidence values provide a direct assessment of various fault/no-fault states to the output consumer. Numeric confidence estimates leave the interpretation to the output consumer, and are useful when multiple consumers are present with differing input requirements. Note that these same rules apply to fault warnings from non-embodiments of the matched filter. Essentially, confidence estimates are fault warnings with different numeric or Boolean statistics such that the aforementioned failure mode property is observed.

Before describing embodiments of the present invention in detail, first consider the possible outcomes when an output is generated for a generic algorithm with fault detection. The algorithm's output consumer may either accept or reject the output based on the confidence estimates. The possible outcomes for using a generic algorithm with fault-detection may be divided into four categories, ranked in order of decreasing desirability.

1. The output is correct (output non-fault) and the fault-detection is not triggered (fault-detection non-fault).

2. The output is incorrect (output fault) and the fault-detection is triggered (fault-detection non-fault).

3. The output is correct (output non-fault) and the fault-detection is triggered (fault-detection fault).

4. The output is incorrect (output fault) and the fault-detection is not triggered (fault-detection fault).

Category 1 represents ideal operation for an algorithm with fault detection. It is also ideal for cases when an algorithm with no fault-detection does not experience an output fault. The output of a (hypothetical) perfect algorithm that never performed out-of-spec and never experienced any fault-detection "false alarms" (i.e. fault-detection fault) would always be classified in Category 1. However, real-world systems do not always work perfectly.

Category 2 represents the next best scenario. In Category 2, an output fault has occurred, but it has been correctly detected by the fault-detection module. When a fault is signaled, the output consumer is expected to ignore the output at a minimum. If the output consumer provides error correction capability (or if such is built into the subject algorithm), then it is (correctly) triggered in the scenario of Category 2. This category is unique to algorithms with fault detection. It occurs when the fault detection is triggered but is working properly. Without fault detection, the cases from this category would instead become part of Category 4.

Category 3 contains cases where fault-detection methods incorrectly signal that the output is in a fault state (i.e. a fault-detection fault has occurred). The effect on the output consumer is the same as for Category 2, except, in this case, the result is wasted data and wasted post-processing (when error correction is erroneously triggered). For cases in this category, the fault detection is responsible for "breaking" the algorithm. However, although data and processing may be wasted, no undetected out-of-spec output is generated. (The loss of data may cause out-of-spec output, but the condition can be detected, since the data loss is known by the algorithm.)

Category 4 is the worst-case scenario for any generic algorithm with built-in fault detection. It is also the default behavior when an output fault occurs for an algorithm with no fault-detection. In this case, the output and the fault-detection method are in simultaneous fault states. The result is undetected out-of-spec behavior by the subject algorithm. If the output consumer is unable to independently detect the failure (which is usually computationally intensive and possibly significantly less reliable), then the fault can propagate throughout the system's entire signal processing pipeline. Such faults can range in severity from minor (e.g., a single bit error in a cellular communication system) to catastrophic (e.g., a mid-air collision between a UAV and another vehicle or structure).

Algorithms without fault detection are "all-or-nothing"; use cases either fall into Category 1 (best) or Category 4 (worst). There is no middle ground. However, for applications where there are no significant negative consequences of undetected output faults, an algorithm without fault detection can be used with no reservations. An example of this type of application is one where a human is the real decision maker, and is available to "clean up" the algorithm's mistakes. In such applications the algorithm's only real purpose is to reduce the workload for humans. Many algorithms developed by academia and used in non-real-time applications fall into this category.

Algorithms with fault detection that are not fault-aware according to this invention have use cases that fall into all four categories. However, these algorithms exhibit an increased probability of Category 4 "dual faults" relative to the fault-aware inventive methods because the algorithm outputs and the fault warnings have substantially overlapping failure modes. However, the consequences of Category 4 use cases are not the same for all applications. A real-time non-critical application could be an example of a use case where traditional fault detection is "good enough". For this type of application, there is not time for a human to "clean up" huge amounts of mistakes, but the fault detection may be "good enough". Many generic real-time algorithms developed by academia or industry that never leave a controlled lab environment fall into this category.

Certain fault-aware embodiments of the present invention may exhibit one or more orders-of-magnitude fewer use cases that fall into Category 4. Because embodiments of the fault-aware techniques described herein provide confidence estimates that do not share all of the same failure modes as the fault-aware output, the probability of simultaneous output and fault-detection faults is statistically decreased because fewer common failure scenarios exist. This is of the most significance for real-time autonomous mission- and safety-critical applications, in which there is no time for a human to "clean up" mistakes and the consequences of undetected mistakes can be catastrophic.

The following disclosure provides a detailed description of embodiments of: (1) a fault-aware matched filter and fault-aware optical flow; and (2) innovative optical flow techniques with novel properties which are extremely well suited for fault-aware augmentation (including the baseline and fault-aware versions).

A matched filter measures similarity between a data vector and another entity such as a function or reference vector set. In general, the data vector represents the input signal with superimposed noise. The reference vector set consists of one or more elements for which similarity is to be measured with respect to the data vector. Alternately, the reference vector set may be defined by a function such that it is not implemented as an actual data input to the system; for example, the function or functions defining the reference vector set may be implemented within the matched filter using any appropriate component(s).

Figure 2A:
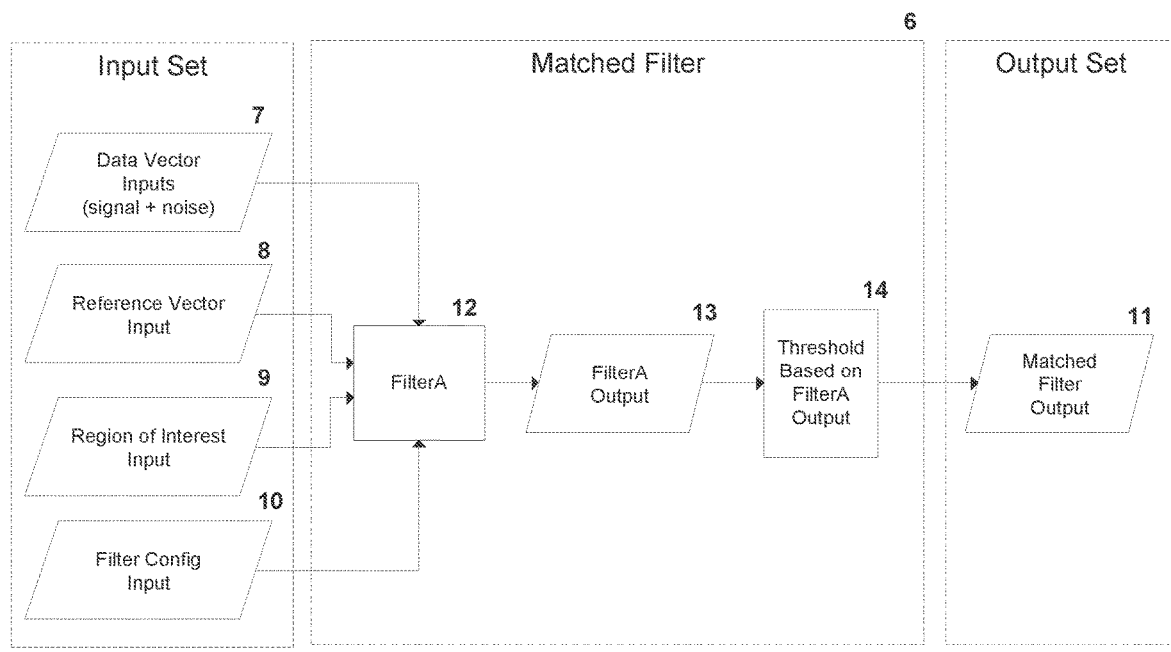
FIG. 2A is a data flow diagram of one embodiment of a traditional (legacy) matched filter with no fault detection and a reference vector set containing one element.
Figure 2B:
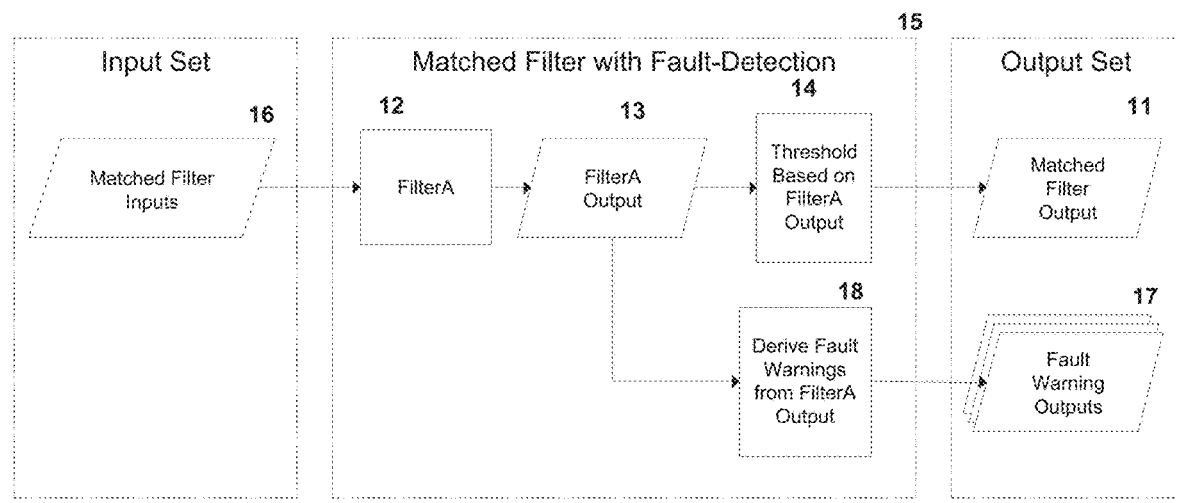
FIG. 2B is a data flow diagram of one embodiment of a traditional (legacy) matched filter with fault detection and a reference vector set containing one element.
Figure 3A:
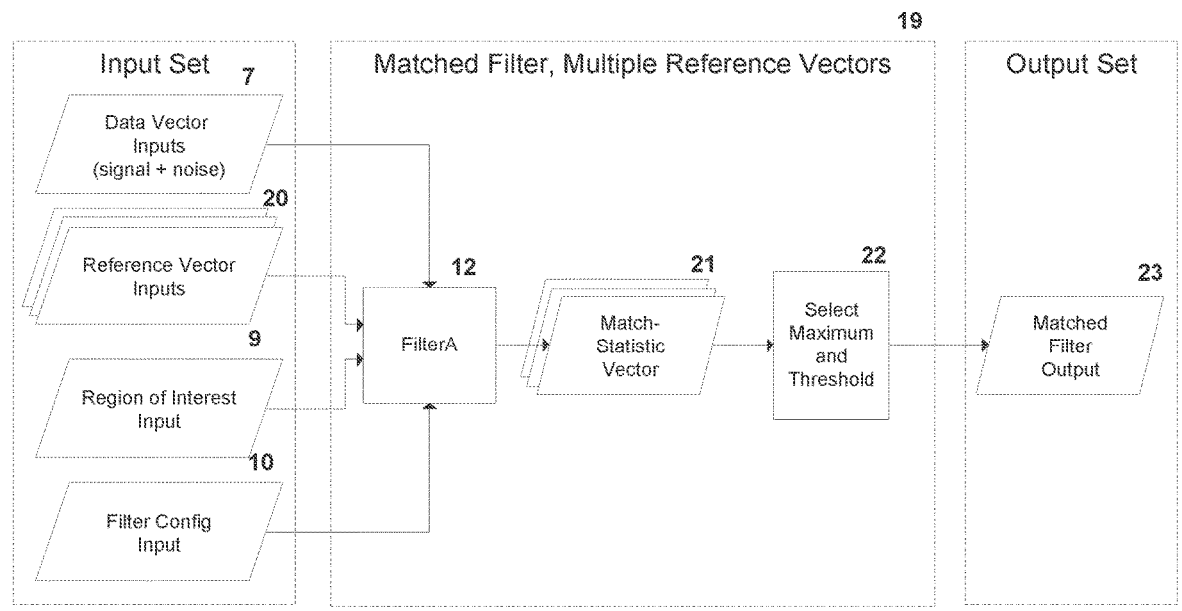
FIG. 3A is a data flow diagram of one embodiment of a traditional (legacy) matched filter with no fault detection and a reference vector set containing a plurality of elements.
Figure 3B:
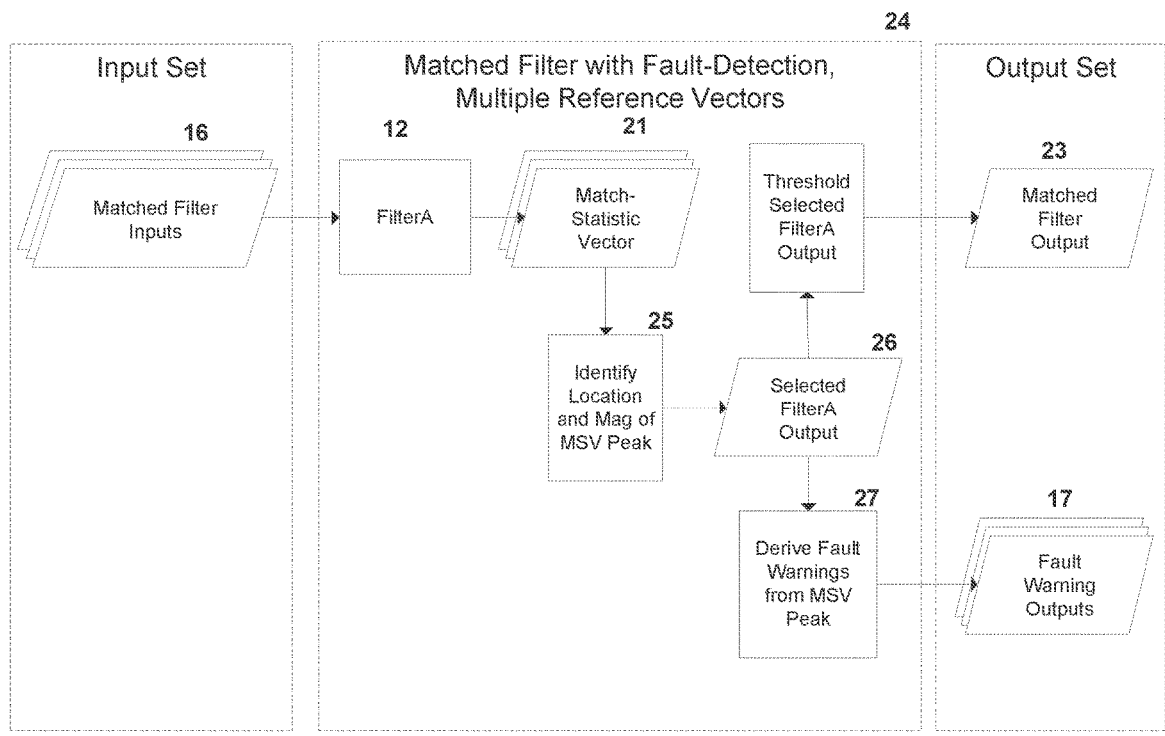
FIG. 3B is a data flow diagram of one embodiment of a traditional (legacy) matched filter with fault detection and a reference vector set containing a plurality of elements.

FIG. 2 (i.e., FIGS. 2A and 2B) and FIG. 3 (i.e., FIGS. 3A and 3B) show embodiments of a traditional matched filter without and with fault-detection for cases where a reference vector input set is present and contains both one and a plurality of elements. The matched filter with a single-element reference vector input set is shown in FIG. 2A. In FIG. 2A, the matched filter 6 has four possible inputs: a single data vector 7, a single reference vector 8, a region of interest (ROI) 9, and a set of filter configuration parameters 10. The ROI 9 and configuration parameters 10 are optional. Additionally, the reference vector 8 can be removed in the case where the data vector 7 is referenced to a function. The matched filter output 11 is an example of a "legacy" or "underlying" matched filter output, as those terms are used herein, and may include one or more values of numeric and/or binary type. The first component of the generic matched filter embodiment, FilterA 12, represents a single filter or a bank of parallel and/or series filters implementing the computations required to derive the matched filter output 11. The FilterA output 13 data block represents all outputs and intermediate products of interest derived during the FilterA block 12 (or passed through from inputs such as the configuration parameters). The final processing step in a generic matched filter is an (optional) thresholding operation 14 based on the FilterA output data product 13. In general, the thresholding operation 14 could instead be other functions, and the term "output transformation function" refers to any function which may be used in place of the thresholding operation 14. The combination of FilterA 12, FilterA output 13, and the thresholding based on FilterA output 14 (or other output transformation function) is an example of a "matched filter".

FIG. 2B extends the generic matched filter embodiment from FIG. 2A to create a generic matched filter with fault-detection capability 15 (also not an inventive embodiment). The matched filter inputs 16 in FIG. 2B are the same as elements 7-10 in FIG. 2A. Likewise, the data flow diagram for the matched filter output computation in FIG. 2B is the same as that in FIG. 2A. The new fault warning output 17 to the filter in FIG. 2B is derived from the FilterA output 13 by block 18. Because the fault warning outputs 17 are derived from the same filter set used to produce the matched filter output 11, the fault warning outputs 17 will exhibit all or nearly all of the same failure modes as the matched filter output 11. Although the matched filter embodiment of FIG. 2B produces "fault warnings" as part of a fault-detection capability, it is not "fault-aware" as that term is used herein.

Referring to FIGS. 3A and 3B, embodiments of a conventional matched filter that extend the reference vector set to multiple elements are shown. The generic matched filter with multiple reference vectors 19 (FIG. 3A) has the same inputs and outputs as the single element version 6 of FIG. 2A, except for a reference vector set with more than one entry 20. The match-statistic vector (MSV) 21 is an array of FilterA outputs where one output exists for each data-reference pair. Therefore, the MSV 21 provides a measure of the strength of the FilterA response between the data vector 7 and each of the reference vectors 20, and is the data structure that enables the filter 19 to select which of the multiple reference vectors 20 is the "best match". The final processing block 22 selects the match statistic vector entry with the maximum (strongest) similarity response and applies a threshold, if applicable. The matched filter output 23 includes information on which data/reference pair was the maximum response.

The generic matched filter with fault detection and multiple reference vectors 24 of FIG. 3B is a combination of FIG. 3A and FIG. 2B. The matched filter 24 of FIG. 3B receives the same inputs 16 as the matched filter 19 of FIG. 3A. In FIG. 3B, the location and magnitude of the maximum MSV response is identified 25 and the maximum element of the MSV 21 is selected 26, and the fault warning outputs 17 are derived from the selected response. Once the maximum-response FilterA output 26 is selected, matched filter output 23 and fault-warning output 17 generation occurs just as in the single reference vector case of FIG. 2B.

Figure 4A:
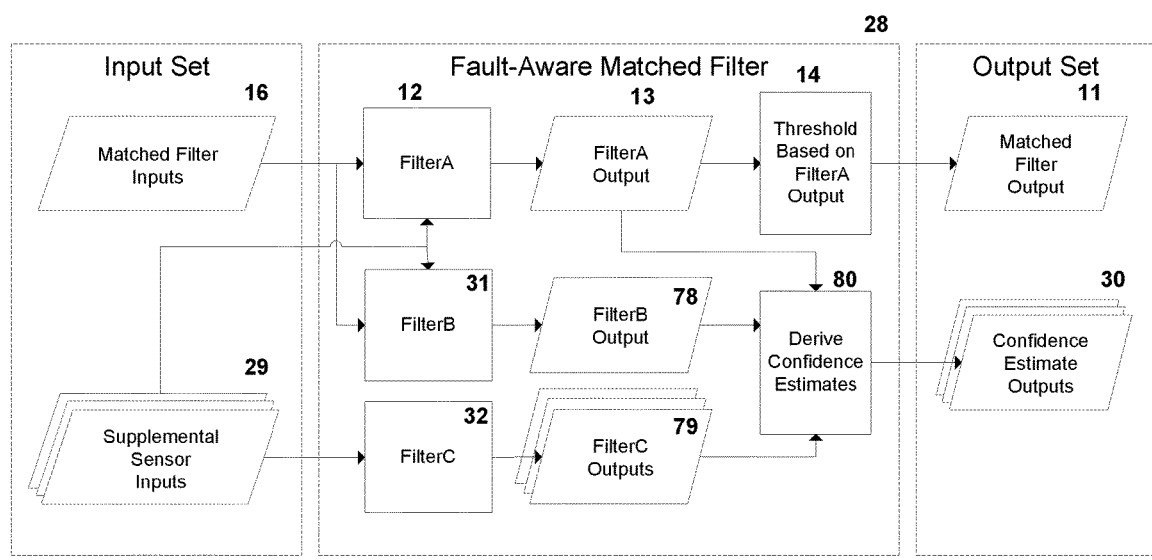
FIG. 4A is a data flow diagram of one embodiment of the present invention as a fault-aware matched filter with a reference vector set containing one element.
Figure 4B:
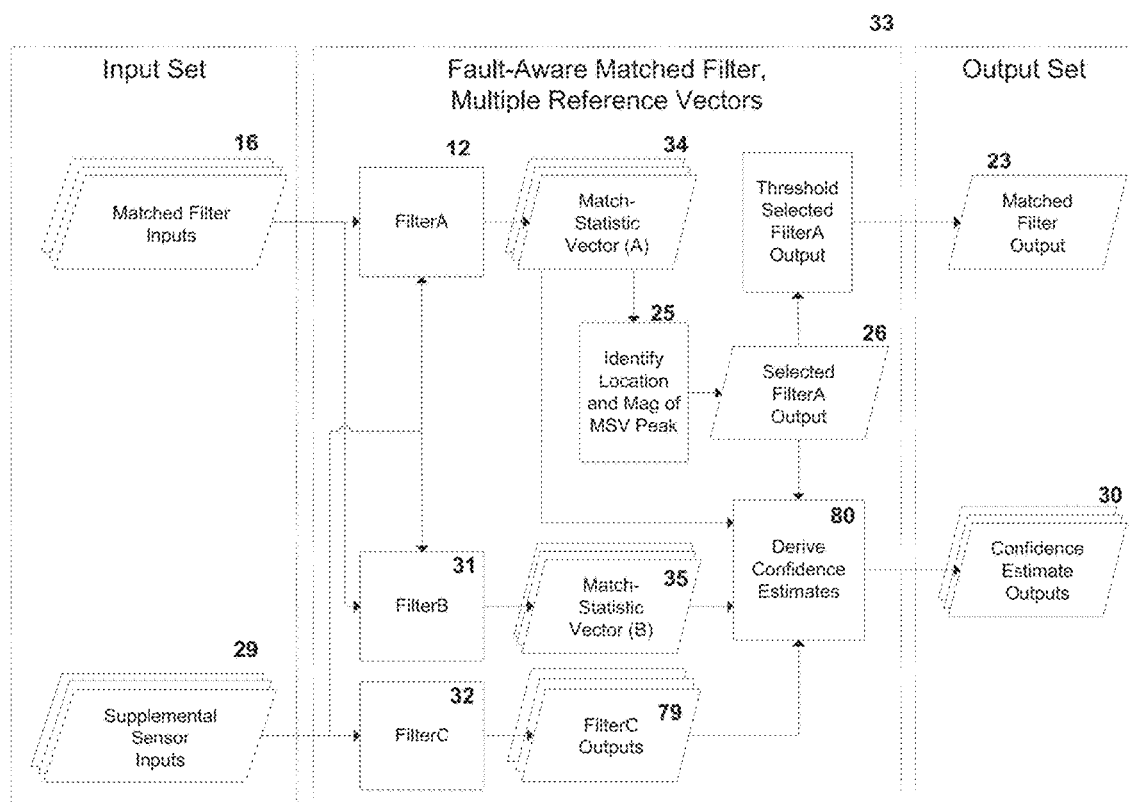
FIG. 4B is a data flow diagram of one embodiment of the present invention as a fault-aware matched filter with a reference vector set containing a plurality of elements.
Figure 4C:
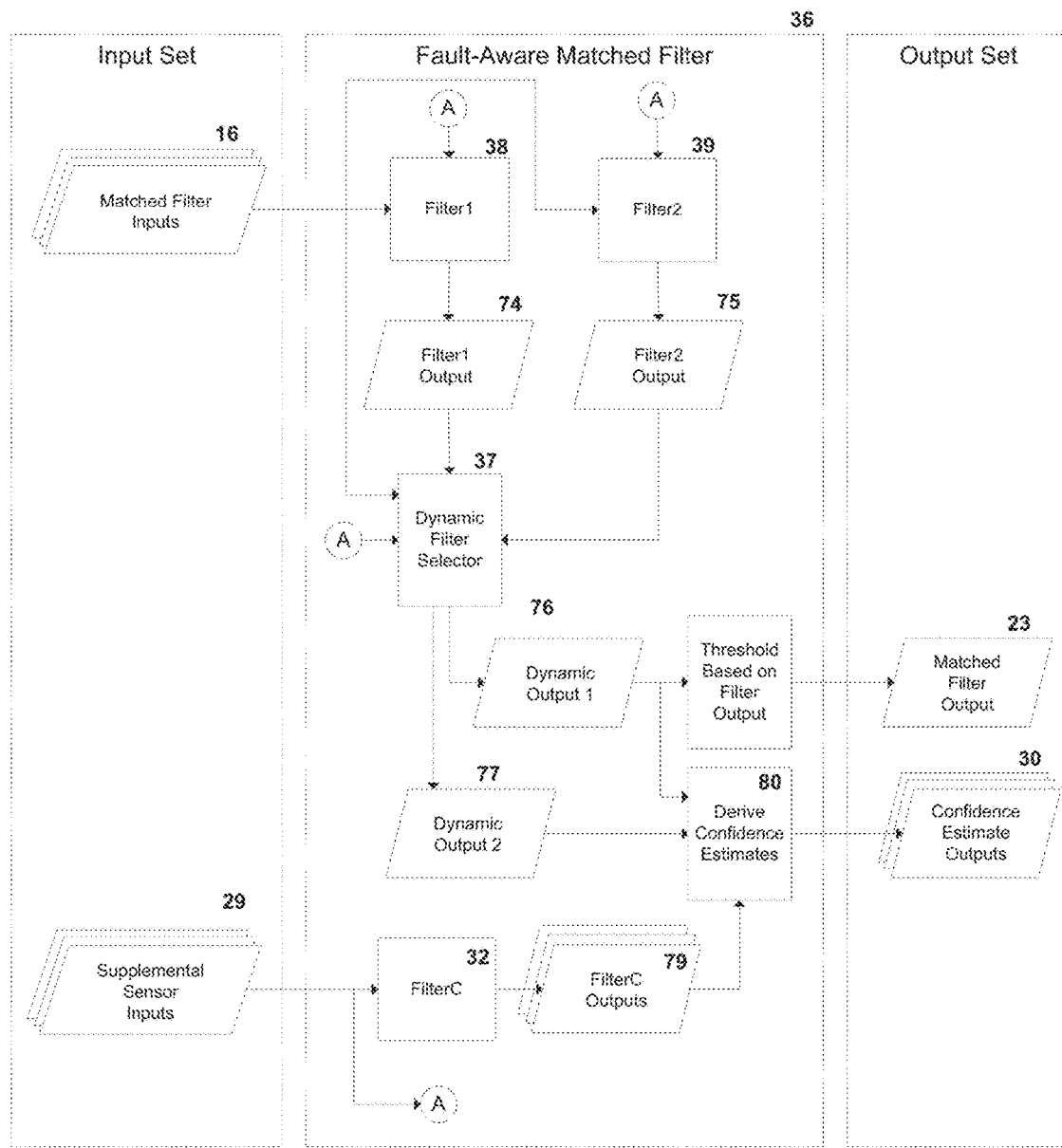
FIG. 4C is a data flow diagram of one embodiment of the present invention as a fault-aware matched filter where the data paths are dynamically selected (i.e. during filter operation) instead of at design time.

Referring to FIG. 4 (i.e., FIGS. 4A, 4B, and 4C), three embodiments of a fault-aware matched filter according to the present invention are depicted. FIG. 4A shows an embodiment of a single reference vector fault-aware matched filter 28. The entirety of the matched filter 6 from FIG. 2A can be seen in FIG. 4A, illustrating that the fault-aware matched filter 28 may be used to augment a traditional matched filter. FIG. 4A shows how supplemental sensors 29 may be integrated as a new input; however, these are shown merely as an example and do not constitute a requirement of the present invention. Output feedback is also an option for the fault-aware matched filter 28, but this is not depicted in FIG. 4A.

The confidence estimates 30 for all of FIG. 4 perform a function that is in some ways similar to the fault warning outputs 17 shown in FIGS. 2B and 3B; however, at least one of the confidence estimate outputs 30 in FIG. 4 has substantially different failure modes than the matched filter output, as previously described. The fault-aware matched filters 28 and 33 of FIGS. 4A and 4B may provide their confidence estimate outputs 30 to the respective filter's output consumer. Additionally, a fault-aware matched filter might derive a third "fallback" output (not shown in the figures) from the supplemental sensor inputs 29 and/or filter feedback (not shown). The fallback output could be used by the output consumer if the confidence estimates 30 indicate that the matched filter output is in a fault state. However, since a "fallback" output is not always possible or desirable, it is not required in embodiments of the invention.

Note the possibility of a modification of the fault-aware matched filter where the output consumer processes the confidence estimates and selects between the matched filter output and a "fallback" output. In this modification, the fault-aware matched filter's output consumer forwards the selected output to its own output consumer.

Internally, the fault-aware matched filter embodiment of FIG. 4A adds two new filter blocks: FilterB 31 and FilterC 32. FilterB 31 is a single filter or a bank of parallel and/or series filters implementing the computations required to derive the confidence estimates 30 from the matched filter inputs 16. FilterC 32 is a single filter or a bank of parallel and/or series filters for the supplemental sensor inputs 29, as needed to derive confidence estimate outputs 30 or any output. The FilterC block 32 is only present if the supplemental sensor inputs 29 are present. The FilterB block 31 must be present if it is the only source for the confidence estimate outputs 30 with substantially different failure modes than FilterA 12. If, however, FilterC 32 can meet the confidence estimate requirement, then FilterB 31 may be omitted. In FIG. 4B, the confidence estimates 30 are derived from the FilterA output 13 and at least one of the FilterB output 78 and the FilterC outputs 79.

Referring to FIG. 4B, an embodiment of the fault-aware matched filter with multiple reference vectors 33 is shown. In this embodiment, the match statistic vector A 34, which is output from FilterA 12, can be used to meet the aforementioned confidence estimate requirement directly if statistics other than the peak or a transformation of the peak response are computed from it. The description below will elaborate on how this may be accomplished in a particular embodiment of the MSV-A 34. If the failure mode requirement for the confidence estimate outputs is met by quantities directly derived from MSV-A 34, then both FilterB and supplemental sensor FilterC signal paths are optional. Otherwise, if the embodiment of FIG. 4B cannot derive 80 suitable confidence estimates 30 from MSV-A 34, then at least one of the FilterB and FilterC data flow paths are required. In FIG. 4B, the confidence estimates 30 are derived from the selected FilterA output 26 and at least one of the Match Statistic Vector (A) 34, the Match Statistic Vector (B) 35, and the FilterC outputs 79.

The embodiment of FIG. 4B can also support output feedback and "fallback" output as described for the embodiment of FIG. 4A. These are not shown in FIG. 4B, and are not required for the embodiment of FIG. 4B to be considered an embodiment of a fault-aware matched filter.

Referring to FIG. 4C, an embodiment of a fault-aware matched filter that selects filter data paths dynamically 36 is shown. In this embodiment 36, Filter1 38 and Filter2 39 represent filter blocks in the same manner as FilterA 12 and FilterB 31. For example, Filter1 38 may be FilterA 12, and Filter2 39 may be FilterB 31. As another example, Filter1 38 may be FilterB 31, and Filter2 39 may be FilterA 12.

In the embodiment of FIG. 4C, a dynamic filter selector 37 maps the data from Filter1 38 and Filter2 39 to dynamic outputs 76 and 77 (which are different from each other). The dynamic filter selector 37 may perform any mapping of outputs 74 and 75 to outputs 76 and 77. For example, the dynamic filter selector 37 may map Filter1 output 74 to dynamic output 76, and map Filter2 output 75 to dynamic output 77. Alternatively, the dynamic filter selector 37 may map Filter1 output 74 to dynamic output 77, and map Filter2 output 75 to dynamic output 76. Furthermore, the sorting of Filter1 Output 74 and Filter2 Output 75 into separate sets could instead be done within the Dynamic Filter Selector 37. In other words, all of the inputs could come into the Dynamic Filter Selector 37 in a single set (e.g., from a single filter) and then be processed and sorted internally by the Dynamic Filter Selector.

The dynamic filter selector 37 performs its selection based on one or more selection inputs. For example, as shown in FIG. 4C, one or more of the matched filter inputs 16 may act as selection inputs to the dynamic filter selector 37. Additionally or alternatively, one or more of the supplemental sensor inputs 29 may act as selection inputs to the dynamic filter selector 37. The dynamic filter selector 37 may use its selection input(s) to choose which mapping to perform (i.e., of outputs 74 and 75 to outputs 76 and 77) using any function.

The dynamic outputs 76 and 77 may then be used in the same way as FilterA Output 13 and FilterB Output 78, respectively, in the fault-aware matched filter embodiment 28 of FIG. 4A. The embodiment of FIG. 4C enables the set of filters which constituted the FilterA and FilterB paths in FIG. 4A instead to be chosen dynamically during operation, instead of at the time of design. This embodiment is significant because it allows the derivation of the matched filter output 23 and confidence estimate outputs 30 to be optimized by selecting the best filters for both jobs based on situational information contained in the inputs.

Although the embodiment of FIG. 4C is only shown for the case of a single-element reference vector input, it may perform the same function for multi-element reference vector sets through an extension similar to that used to extend the embodiment of FIG. 4A to that of FIG. 4B. Also, the embodiment of FIG. 4C may support output feedback and "fallback" output, although these are not shown in FIG. 4C.

An example embodiment of a conventional matched filter with fault detection and multiple reference vectors (FIG. 3B) is the matched filter used to derive the optical flow in the KLT algorithm (Lucas and Kanade 1981; Tomasi and Kanade 1991; Shi and Tomasi 1994). In the KLT optical flow algorithm, a single optical flow sample is computed from a gradient-based product that is derived by comparing a reference image template (data vector) and possible matches within a region of interest in a larger image (reference vector set). The algorithm is processed iteratively such that the location of the template in the reference vector set converges (hopefully) towards the maximum response. When the output position displacement changes by less than a specified value (configuration parameter), then the algorithm breaks and the output is selected. The MSV in this example is the set of all data at each iterative step. In KLT, the flow sample is discarded if the final gradient product is less than some specified threshold. However, the magnitude of the gradient product is also used to determine the output location during each iterative pass.

The key observation from this example is that the matched filter used by the KLT algorithm derives both the output and failure warnings from the same numeric value: the gradient peak. The thresholding operation provides a method for interpreting the numeric data as Boolean fault/no-fault, but it does not provide substantially different failure modes than the raw gradient value used to generate the output.

Embodiments of the match statistic vector 21 will now be described. The match statistic vector 21 (and other match statistic vectors disclosed herein) may represent a variable dimensional (e.g., 1-D, 2-D, etc.) measure of similarity between the data vector 7 and each of a plurality of reference vectors 20. As a result, the match statistic vector 21 may have N entries, where N is the number of reference vectors 20. The match statistic vector entry #i (denoted as MSV[i]) contains information on the strength of the match between the data vector 7 (denoted DV) and reference vector #i (denoted RV[i]). In other words, MSV[i] is a measure of similarity between DV and RV[i]. Additionally, it is desirable (but not always absolutely necessary) to express the match statistic vector 21 similarity in a normalized form such that 0.0 represents an ideal non-match and 1.0 represents an ideal (exact) match between DV and RV[i]. This normalized form is called "normalized positive match at unity" or NPMU form.

There are two separate classes of match statistic vector. The class of match statistic vector is determined by the filter's application. The match statistic vector classes are: (1) localized, and (2) non-localized. A localized match statistic vector, also called a match statistic map, is one in which the order of elements has some meaning (and is usually part of the desired output). Since the arrangement of the entries of a localized match statistic vector has meaning, these vectors can be either one- or multi-dimensional. In contrast, the order of a non-localized match statistic vector has no meaning. Non-localized vectors are usually 1-D, since no additional benefit is gained from higher-dimensional representations. From this point on, the term match statistic map (MSM) will be used to refer to a localized match statistic vector. In the context of an MSM, the term match statistic vector (MSV) will refer exclusively to the non-localized class. MSV will also be used as a general term where no context is specified.

The difference between an MSV and an MSM can be more clearly explained with usage examples. An example of a matched filter application that would require an MSV is the recognition of faces within an image. In this example, the goal of the filter is the comparison of a picture of an individual's face (the data vector) to other faces in an unordered database (the reference vector). Since the database is unordered, there is no meaning associated with the index of each record within the database. Therefore, this application would use an MSV. However, a matched filter application that finds faces within an image (any face . . . not specific faces) would require an MSM, because the position (localization) of the face in the input image is the output product. Therefore, an end-user system that finds and identifies faces within an image would require two fault-aware match filters. The filter to find the faces would contain an MSM, and the filter to identify the faces would contain an MSV.

This example references one possible embodiment of the fault-aware matched filter 33 shown in FIG. 4B. In this example, the matched filter output 23 provides the answer to the question, "Which of the reference vector inputs, if any, is the best match for the data vector input?"

The confidence estimate outputs 30 may, for example, represent quantitative answers to the following questions:

1. "How strong is the match between the data vector and the selected reference vector?"
2. "How much stronger is the selected match compared to the rest of the reference vectors?"
3. (Localized only) "Does the spatial accuracy of the output meet the system spec?"

Since the quantitative measure associated with question 1 is required in order to select the best match as the filter's output, this quantitative measure represents an instance of FilterA Output that is used to derive both the filter output 23 and the confidence estimates 30. In fact, this same quantitative measure is routinely used to derive fault warnings in generic (i.e. non-inventive embodiments) of a matched filter (ex: the matched filter within the KLT algorithm).

Quantitative measures associated with questions 2 and 3 are not directly used to derive the output. They can be derived directly from MSV-A 34 and are useful as confidence estimates that exhibit substantially different failure modes with respect to the quantitative metric of question 1 (which is used to produce the output). When the confidence estimates 30 include the answers to questions 2 and 3, then the filter 33 of this example is an embodiment of a fault-aware matched filter, as that term is used herein. Additionally, because confidence estimates 30 with substantially different failure modes as the output 23 have been derived directly from MSV-A 34, the FilterB and FilterC data flow paths are both entirely optional for this example embodiment. (Remember that this is only an option when multiple reference vectors are present).

Quantitative metrics will now be described that can be derived from an MSV or MSM which are examples of confidence estimates 30. These are not guaranteed to be optimal for any application; however, they are observed to be useful for optical flow applications of fault-aware matched filters implemented according to embodiments of the present invention.

Figure 5A:
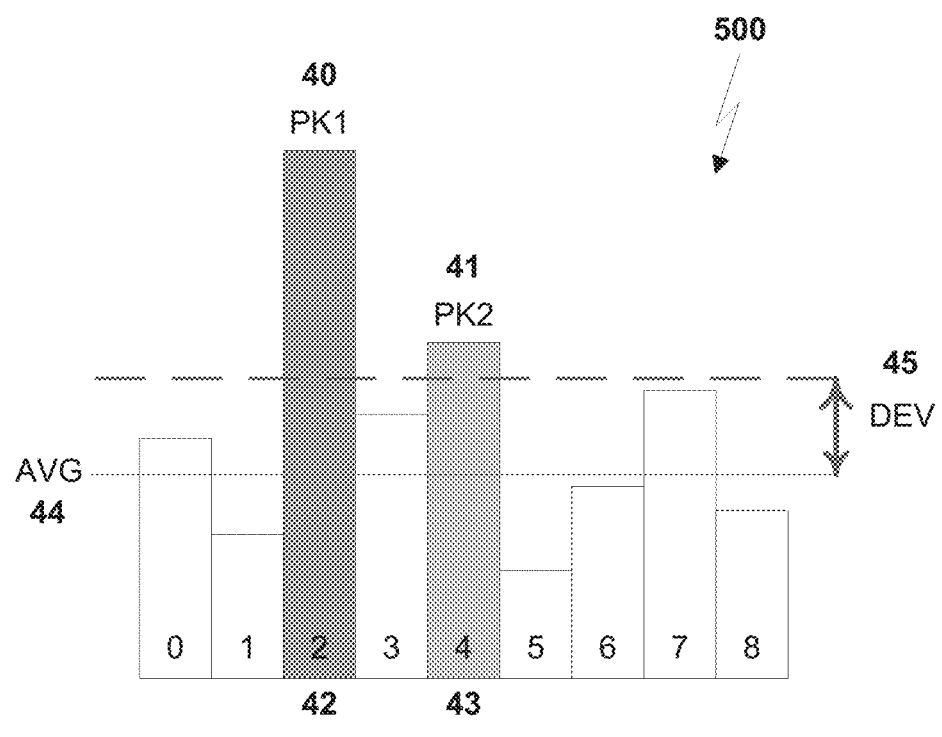
FIG. 5A is a bar graph representation of an example match statistic vector with no localization (MSV) according to one embodiment of the present invention.

Referring to FIG. 5A, an example MSV bar graph 500 is shown according to one embodiment of the present invention. The bar graph 500 in FIG. 5A shows important quantities from the MSV that can be used to derive one possible (useful) set of confidence estimates 30. This example is an MSV of length nine, implying the reference vector input set has nine elements. In the embodiment represented by FIG. 5A, no localization information is encoded in their order. The largest peak 42 in the example MSV occurs in bin two and has a magnitude of PK1 40. Therefore, the filter output (FIG. 1A) would select reference vector input set element #2 as the output. Since the elements in the MSV represent match strengths between the data vector and each reference vector, PK1 40 may be referred to herein as the "peak match strength."

The second largest peak 43 occurs in bin four and has a magnitude of PK2 41. This peak represents the non-selected reference vector with the most similarity to the data vector (i.e., the second-highest of the match strengths in the MSV). AVG 44 is the average of all peaks, and DEV 45 is the standard deviation of all peaks (both computations can optionally omit the peak magnitude, PK1).

The most obvious confidence estimate is the absolute MSV peak, PK1 40, since it directly answers question 1, above. However, because this metric was directly used to select the example matched filter output, the output has identical failure modes to this confidence estimate. PK1 40 is allowed as a confidence estimate, but since it does not meet the previously discussed requirement regarding confidence estimate failure modes, it cannot be the only confidence estimate. Note: all known matched filters with multiple reference vectors use the MSV peak to select the output. They may use dramatically different terminology to describe what they are doing, but the output is always selected according to the "best" response, which is the MSV peak in this example. Because the peak magnitude is available, it is frequently used for fault detection by state-of-the-art embodiments (again, the matched filter in the KLT optical flow algorithm is an example of this assertion).

Note that transformations including but not limited to thresholding and re-scaling can be applied to the peak magnitude PK1 40 (thresholding is the most popular by far). No transformation exists that can achieve the level of error rejection desired for use with the fault-aware matched filter using PK1 40 alone. Therefore, confidence estimates for a fault-aware matched filter embodiment cannot be generated from transformations to the peak magnitude PK1 40 alone or in combination with other operations only involving PK1 40.

Another quantitative metric derivable from the MSV is the ratio PK1/PK2. Qualitatively, the PK1/PK2 ratio is a measure of how close the next best option is to the selection; this ratio can be used to answer question 2, above. In practice, when the input data vector is corrupted by certain types of noise (e.g. uniform, Gaussian, etc.), the peak magnitude PK1 40 will decrease. However, PK2 41 will decrease by almost the same percentage, so that the PK1/PK2 ratio will remain nearly unchanged. This metric is far less sensitive to the specified types of noise and does not share them as a failure mode with the output derived from PK1 40. Since the listed noise types are significant for nearly any type of system, inclusion of the PK1/PK2 ratio does meet the requirement for selecting confidence estimates, and an embodiment using this quantitative output is a fault-aware matched filter.

Other quantitative metrics for testing question 2 are summarized in Table 1. All of these metrics are valid for both localized and non-localized MSV, and other metrics are possible in addition to those listed. Note that k in Table 1 is a predetermined constant value.

TABLE 1

| Confidence Metrics (MSV & MSM) | |
| --- | --- |
| Name | Formula |
| Absolute peak magnitude | PK1 |
| Similarity ambiguity ratio | PK1/PK2 |
| Similarity ambiguity difference | PK1 − PK2 |
| Peak to mean ratio | PK1/AVG |
| Peak to mean difference | PK1 − AVG |
| Peak to deviated mean ratio | PK1/(AVG + k * DEV) |
| Peak to deviated mean difference | PK1 − (AVG + k * DEV) |

Figure 5B:
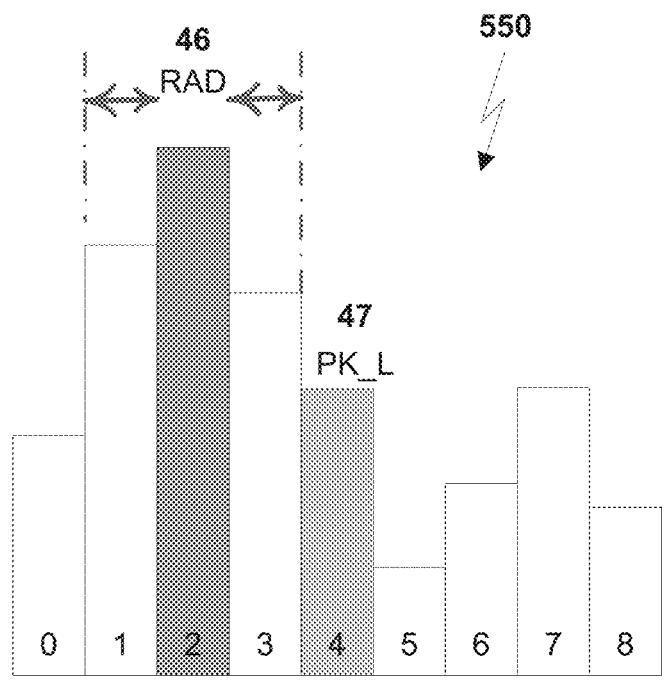
FIG. 5B is a bar graph representation of an example 1-D match statistic vector with localization (MSM) according to one embodiment of the present invention.

Referring to FIG. 5B, an example MSM bar graph 550 is shown according to one embodiment of the present invention. The MSM bar graph 550 in FIG. 5B shows important quantities from an MSM that can be used to derive some possible metrics that make up the confidence estimate outputs 30 when localization information exists in the reference vector set. The example MSM in FIG. 5B may, for example, represent the result of a 1-D template search operation, where bin j is adjacent in the search window to bins (j−1) and (j+1). The length of the example MSM illustrated in FIG. 5B is nine, implying there are nine ordered reference data sets. The largest peak in the example MSM occurs in bin two.

Additional metrics may be identified based on the encoded order information (localization). An example metric that can be derived from a match statistic map with encoded order information is one that addresses question 3 from paragraph 0070. The idea of spatial accuracy can be represented in the MSM by the concept of a "local radius," represented by RAD 46 in FIG. 5B. The local radius represents the positional margin of uncertainty allowed by the application in quantized bin units (or pixels for images). It may have any non-negative value. The example in FIG. 5B shows a local radius RAD=1. The two peaks closest to PK1 and outside of the region defined by the local radius are used to test the positional margin of uncertainty with respect to the local radius. In this example, these are bins 0 and 4. Of these, the maximum, PK_L 47, is found in bin 4. In other words, PK_L is the higher (maximum) of the two match strengths MSM[j+RAD+1] and MSM[j−RAD−1], where j is the index of the peak match strength.

Table 2 lists confidence metrics that may be derived from the example to answer question 3, above. As with the previous example, this list is not all-inclusive and is not optimized for any application.

The first two metrics in Table 2 measure the relative strength between the absolute peak and the local similarity peak. The last two metrics measure the position of the absolute peak with respect to the MSM boundary. Tests with respect to the boundary are relevant because peaks located near the bounds of the MSM are inherently less reliable than those located near the center.

TABLE 2

Confidence Metrics (MSM Only)

| Name | Formula | Assertions Tested |
|---|---|---|
| Local similarity ratio | PK1/PK_L | 3 |
| Local similarity difference | PK1 − PK_L | 3 |
| Border uncertainty #1 | (index(PK1) > 0) AND (index (PK1) < N − 1) | 3 |
| Border uncertainty #2 | (index (PK1) > RAD) AND (index (PK1) < N − RAD − 1) | 3 |

As described above, the confidence estimate outputs 30 may be derived from any combination of one or more of the metrics disclosed herein. In particular, it may be useful to derive the confidence estimates from a combination of the peak match strength PK1 40 and at least one metric drawn from Tables 2 and 3.

An optical flow algorithm is a method for measuring the apparent vector displacement between images in a sequence. When images in the sequence are not acquired at the same time, the vector displacement also corresponds to an apparent velocity in image space. Otherwise, the vector displacement corresponds to a difference in instantaneous camera pose. The image sequence set requires a minimum of two images, although any greater number of images can be used. The act of measuring the optical flow for an input image sequence with more than two images is performed by daisy-chaining the optical flow operation for two pairs across all sequential image pairs in the input sequence. Because this is a trivial extension for those skilled in the art, the example embodiments in this disclosure are limited to two input images to minimize complexity in the drawings.

The optical flow output defines a coregistration between the images in the sequence (e.g., between the first image input 49 and the second image input 50), where the act of coregistration provides the information necessary to "undo" or "reverse" the displacement between the images at the sample locations. Algorithms exist to estimate the coregistration for the entirety of all input images from a limited set of optical flow samples; these algorithms are examples of consumers for optical flow output.

Optical flow systems include matched filters or other components which perform the same functions as a matched filter, and these components are a significant portion of the complexity. In general, at least one matched filter operation (i.e., an operation performed by a matched filter or its functional equivalent) is performed per optical flow sample. There is no standardized matched filter used for optical flow; state-of-the-art optical flow algorithm development requires custom filters.

Figure 6:
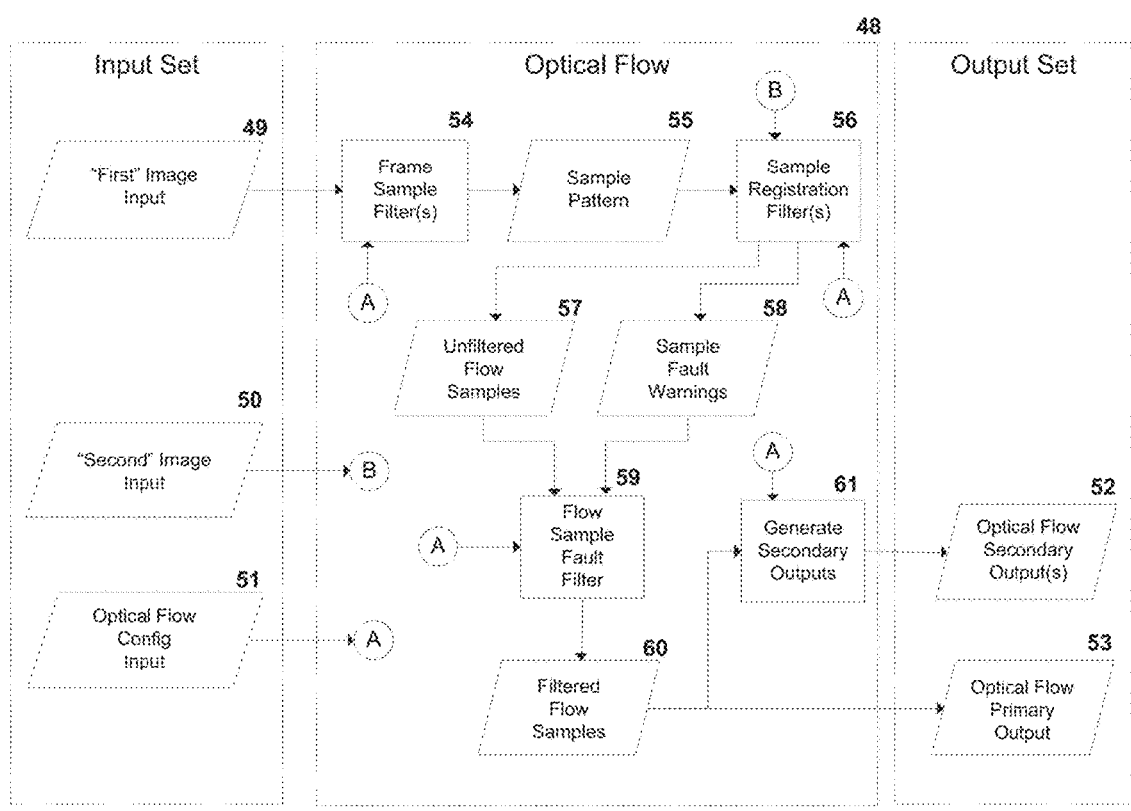
FIG. 6 is a data flow diagram of one embodiment of a "generic" optical flow algorithm.

Referring to FIG. 6, a representative embodiment of a data flow diagram for a generic optical flow processor 48 (prior art) is shown. The input set to the processor 48 consists of a "first" image input 49 and a "second" image input 50, where the "second" image input has a relative position subsequent to the "first" image input in the image input sequence. The optical flow configuration input 51 is the set of all configuration and control parameters required by the optical flow processor 48. The output set to the processor 48 consists of an optical flow primary output 53 and an optical flow secondary output 52. The primary output 53 is an array of velocity vectors spatially registered to the input images 49 and 50. The secondary output 52 can consist of any other secondary quantities that are required as output for a particular embodiment of an optical flow processor. Secondary output examples include but are not limited to acceleration data or copies of any output of the matched filters used to derive each output sample.

The first step in the derivation of the optical flow output set in the embodiment of FIG. 6 is application of a frame sample filter 54 to the first image input 49. The frame sample filter 54 implements selection of the desired sample pattern for the optical flow field. Many ways for accomplishing this exist, such as the method of Shi and Tomasi 1994 which identified "good features to track". If the frame sample filter 54 is implemented as an embodiment of Shi and Tomasi's method then it will consist of, at a minimum, pre-processing filters (e.g. low-pass) and an array of matched filters. The output set of these matched filters is an array of sample coordinates sorted according to the strength of the matched filter response (equivalent to PK1 40 from FIG. 5A). The filters are selected according to the N strongest filter responses above a threshold, resulting in between 0 and N flow samples in the resulting sample pattern 55. Note that other methods exist for implementing the frame sample filter 54. The simplest possible method is a static sample pattern (e.g. grid) that is specified at filter design time. In this case, the frame sample filter 54 does not contain a matched filter of any type. Therefore, integration of a matched filter into the frame sample filter 54 is not required for the optical flow processor 48.

The next step in the derivation of the optical flow output set in the embodiment of FIG. 6 is application of a sample registration filter 56 to the second image input 50. In this step, the second image input 50 is processed to find the locations of the "best match" for each sample in the sample pattern 55. This step may include arbitrarily complicated pre- and post-processing, but the act of identifying the "best match" for each sample typically is performed by a matched filter with fault detection. Any useful conventional optical flow algorithm would implement the matched filter with fault detection of FIG. 3B such that the matched filter output 23 generates the set of unfiltered flow samples 57 and the matched filter fault warning outputs 17 generates the sample fault warnings 58. The unfiltered flow samples 57 are a set of optical flow samples such that each element (called an "optical flow sample") in the set defines a coregistration between first image input 49 and second image input 50. The designation "unfiltered" for the unfiltered flow samples 57 does not imply that the unfiltered flow samples 57 were not produced using a filter, but rather that flow samples which are in-fault have not yet been removed from the unfiltered flow samples 57. The sample fault warnings 58 are a set of quantitative measures corresponding to each optical flow sample representing a degree of confidence in the coregistration. Additionally, the sample fault warnings can be used to identify which, if any, of the elements of the unfiltered flow samples 57 are in-fault.

Note that the process of creating the coregistration also creates the displacement and/or velocity vector output that are the primary output of an optical flow algorithm.

Next, the flow sample fault filter 59 will process the unfiltered flow samples 57 and the sample fault warnings 58 to remove any flow sample faults signaled in the sample fault warnings 58. The flow sample fault filter is the optical flow algorithm component that is the first output consumer of the matched filter in the sample registration filter 56. The output of the flow sample fault filter 59 is a set of filtered flow samples 60 such that between zero and N of the original N flow field samples in the sample pattern 55 remain. In contrast with the unfiltered flow samples 57, the designation "filtered" for the filtered flow samples 60 means that flow samples which are in-fault have been removed from the filtered flow samples 60.

The final step is to generate secondary outputs 61, if any, and to output all elements of the output set 52-53. Note that, although conventional optical flow algorithms may elect to forward any fault warnings from the matched filters to the output consumers via the secondary output 52, these fault warnings are not used by the optical flow algorithm to assess the suitability of its output with respect to the requirements.

A critical limitation of the state-of-the-art optical flow is that no reliable method exists for dynamically detecting the presence of a flow field fault (not to be confused with a flow sample fault . . . see paragraph 0016). Any method for detecting a flow field fault should not have significantly overlapping failure modes with the optical flow primary output 53 for the same reasons discussed for the fault-aware matched filter. Unfortunately, this need is not met by the act of recording sample fault warnings 58 in the optical flow secondary output 52 according to the embodiment description for FIG. 6. This is because the optical flow primary output 53 is essentially derived from the matched filter output 23 while the sample fault warnings 58 are derived from the matched filter's fault warning output, and the two outputs from the matched filter 24 of FIG. 3B have significantly overlapping failure modes.

Embodiments of the present invention for computing fault-aware optical flow address the limitation of the current state of the art through four embodiments that will now be described. Each such embodiment is a variation on the fault aware optical flow 62 embodiment shown in FIG. 7. The input and output sets for the example embodiment shown in FIG. 7 include some of the same inputs as those shown in FIG. 6 (namely, the first image input 49, the second image input 50, and the optical flow configuration input 51), but may also include additional inputs. For example, the input set for the fault-aware optical flow processor 62 of FIG. 7 includes supplemental sensor inputs 63. These (optional) supplemental sensor inputs 63 are utilized by the frame sample filter 66 and/or the sample registration filter 67 for both predictive and fault-reduction means. The data for the supplemental sensor input 63 includes data sourced from hardware with differing failure modes than the imager used to acquire the input images 49-50. One example embodiment of fault-aware optical flow might elect to use data from accelerometer and rate gyros as supplemental sensor inputs 63.

Figure 7:
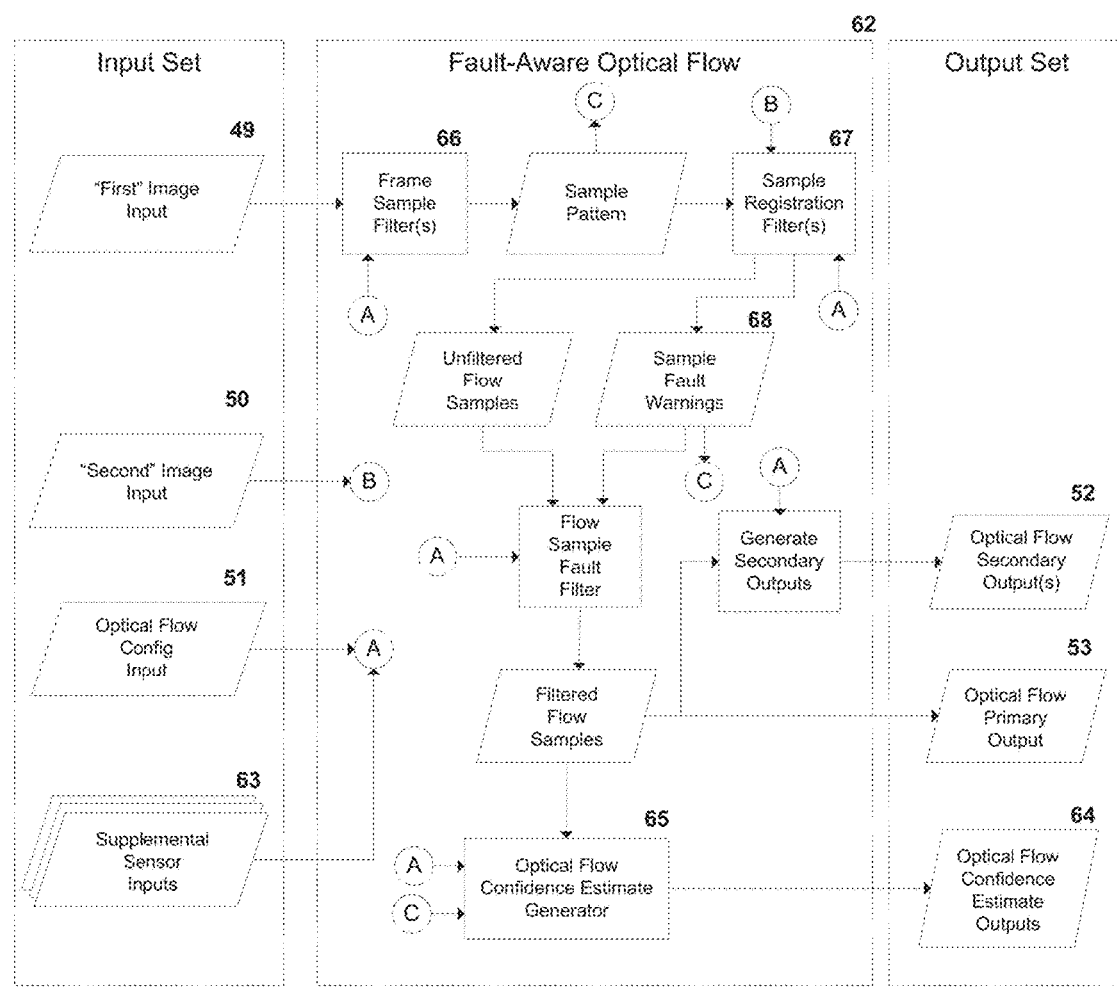
FIG. 7 is a data flow diagram of one embodiment of the present invention as a fault-aware optical flow.

The output set of FIG. 7 includes the optical flow secondary outputs 52 and optical flow primary output 53 of FIG. 6, but also includes optical flow confidence estimate outputs 64 that are derived by an optical flow confidence estimate generator 65. The optical flow confidence estimate generator 65 produces the confidence estimate outputs 64 from at least one of the supplemental sensor inputs 63, the optical flow configuration input 51, the sample fault warnings 68, and the filtered flow samples 60. In an embodiment of fault-aware optical flow, the frame sample filter 66 and the sample registration filter 67 may contain fault-aware matched filters (e.g., of the type shown in FIG. 4B or FIG. 4C). If the sample registration filter 67 contains a fault-aware matched filter, then the sample fault warnings 68 are confidence estimates for the matched filter output according to the definition provided above in connection with the fault-aware matched filter.

One embodiment of fault-aware optical flow utilizes supplemental sensor inputs 63 for output prediction and fault detection for one or both of the frame sample filter 66 and the sample registration filter. In this inventive embodiment, the frame sample filter 66 and the sample registration filter 67 can integrate fault-aware matched filters or they can be as described for the embodiment of FIG. 6. In this embodiment, the optical flow confidence estimate generator 65 and the associated optical flow confidence estimate outputs 64 are optional.

In other embodiments of fault-aware optical flow, the supplemental sensor inputs 63 are optional. A second embodiment of fault-aware optical flow utilizes fault-aware matched filters in the sample registration filter 67. The fault-aware matched filter may optionally be included as part of the frame sample filter 66. In this embodiment of fault-aware optical flow, the fault detection performance of the flow sample fault filter 59 will be improved because the sample fault warnings 68 are embodiments of fault-aware matched filter confidence estimates 30. In this embodiment, no optical flow confidence estimate outputs 64 are generated.

In a third embodiment of fault-aware optical flow, the frame sample filter 66 and sample registration filter 67 include the fault-aware matched filter in the manner described above, and the optical flow confidence estimate outputs 64 are also present. In a fourth embodiment, the frame sample filter 66 and sample registration filter 67 do not include a fault-aware matched filter. For this embodiment, the optical flow confidence estimate generator 65 and associated outputs 64 must be present.

When fault-aware optical flow is to be applied to machine vision for unmanned aerial vehicles, it may be useful for the matched filter to satisfy particular requirements. In particular, certain benefits may be obtained by enabling a matched filter's MSM to 1) exhibit extreme selectivity, 2) provide noise-rejection for non-Gaussian error sources, and 3) provide computational complexity comparable to absolute error or RMS error metrics. In particular, these qualities may enable the rejection of flow field faults corresponding to real-world events such as camera out-of-focus issues and rapidly-varying solar effects. No matched filter traditionally used for optical flow meets these needs.

Embodiments of the present invention use a measure of similarity called correntropy to provide these benefits to fault-aware optical flow. In particular, certain embodiments of the present invention use a correntropy matched filter in which the correntropy exponential function is implemented using a lookup table enhancement. Such an implementation provides all three of the benefits listed above.

For example, embodiments of the present invention include optical flow techniques referred to herein as "correntropy optical flow," in which the FilterA 12 block of FIGS. 2A, 2B, 3A, and 3B is implemented in whole or part using an embodiment of the correntropy matched filter.

As another embodiment, embodiments of the present invention include fault-aware optical flow techniques referred to herein as "fault-aware correntropy optical flow," in which the correntropy matched filter is augmented with one of the fault-aware matched filters disclosed herein. The fault-aware correntropy matched filter may be integrated into the frame sample filter 66 and/or sample registration filter 67 (FIG. 7) according to one of the two embodiments of fault-aware optical flow that utilize a fault-aware matched filter.

Some possible embodiments for the optical flow confidence estimate outputs 64 will now be described. The following discussion is not meant to be inclusive or to represent an "optimal" list for any application. Rather, this list represents an enabling disclosure for some confidence estimates that are useful for some applications.

1. Flow sample count—The number of optical flow samples remaining in the optical flow primary output 53 or within a region of interest is a useful metric. Some applications (e.g. 3-D motion estimation via optical flow and structure-from-motion) require a minimum number of flow samples. Since the flow sample fault filter 59 can dynamically remove samples at run time, there is no way to guarantee that the required sample counts will be present.

2. Flow sample density—The density of optical flow samples for a region of interest. Visual targeting applications can use this metric as a confidence estimate.

3. Flow magnitude—The magnitude of the flow in a region of interest (or average across the entire scene) is useful as a confidence estimate when dealing with severely quantized images. In these cases, the quantization error (or other error) for "short" length vectors can become significant. The optical flow output specification may elect to declare that flow vectors of insufficient length are indeterminate and indicative of a fault condition.

Other confidence estimates are possible; the set provided merely represents three examples. Other optical flow confidence estimates may include positional information or derive a "confidence map" from the filtered flow samples and numeric fault warning (or fault-aware matched filter confidence estimate) data. The possible combinations are endless; however, the optical flow confidence estimates should possess failure modes with significant differences compared to the optical flow output.

Figure 8:
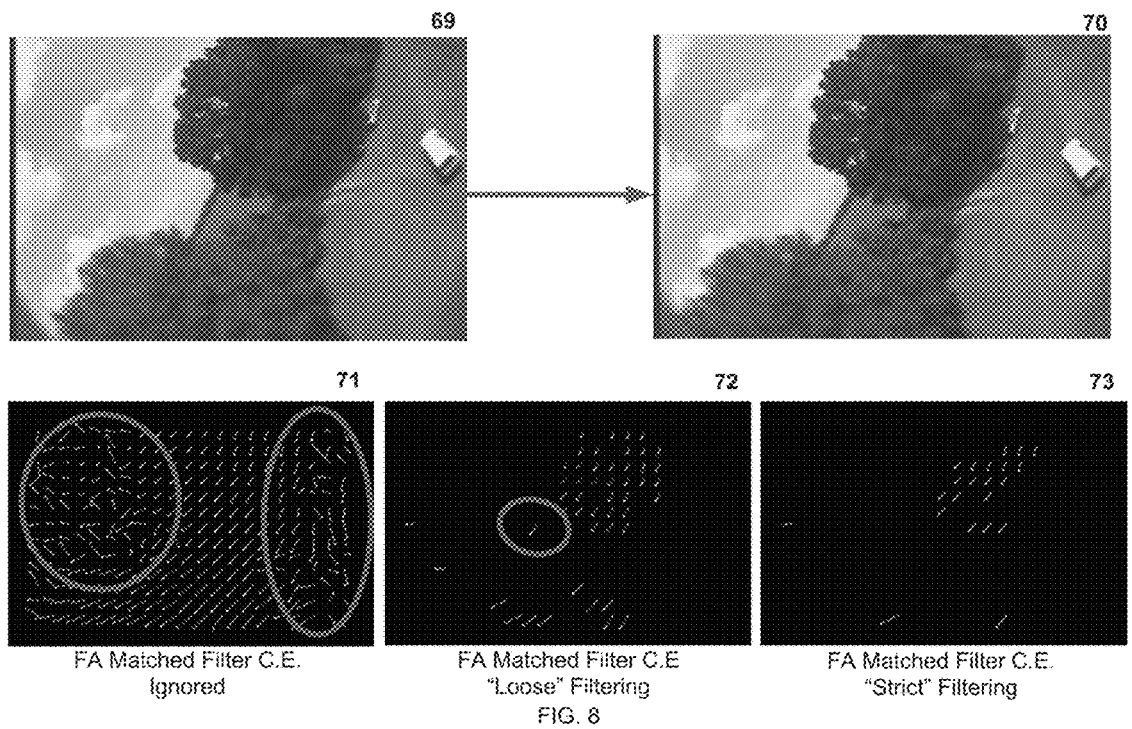
FIG. 8 shows a graphical representation of the image input and vector field output from a realized embodiment of a fault-aware optical flow algorithm. Three outputs are shown with varying output generating behavior that will be explained in the Detailed Description section.

Referring to FIG. 8, a visual representation of the output of a fault-aware correntropy optical flow field is shown for an image sequence acquired from a forward-facing camera of a small unmanned aerial system. The top two images in FIG. 8 show the first 69 and second 70 image inputs, which are functionally equivalent to the "first" image input 49 and "second" image input 50 of the fault-aware optical flow embodiment in FIG. 7. The difference between the images is difficult to see by an untrained eye; however, the second input image 70 is translated slightly down and rotated clockwise with respect to the first input image 69. This particular image pair is extremely challenging for modern optical flow algorithms for reasons that are not obvious to the naked eye. First, a significant amount of motion blur is present due to the wide field-of-view and motion of the aircraft. Second, the camera is slightly out-of-focus due to a rough landing on a previous flight. Third, a slight illumination variation exists across frames due to orientation variations of the camera with respect to the sun (barely detectable by the naked eye in the sky region for high quality reproductions; otherwise, not evident to the naked eye). The illumination variation is the most severe issue, because it is a direct violation of a fundamental constraint for optical flow. When this occurs in real-world scenes, the fundamental assumptions governing the measurement of optical flow are violated and flow sample faults are guaranteed.

Regarding the visualization 71 of the fault-aware correntropy optical flow algorithm's unfiltered flow samples depicted in FIG. 8, the observation was made that significantly fewer outliers were present in the unfiltered flow samples due to the superior performance of the correntropy matched filter. The flow sample faults circled in the unfiltered sample visualization 71 are significantly less in number compared to any other tested optical flow algorithm, including KLT.

This embodiment of fault-aware correntropy optical flow utilized a fault-aware correntropy matched filter in the sample registration filter 67. The fault-aware correntropy matched filter confidence estimates used in this example were the simplest possible set that could be derived directly from the match statistic map. The first estimate chosen was the peak magnitude (PK1 40 from FIG. 5A). Although a useful metric, previous discussion clearly indicates that PK1 40 cannot be the only metric selected.

The second metric selected as a confidence estimate for the fault-aware correntropy matched filter embedded in the sample registration filter 67 was the PK1/PK2 ratio. The PK1/PK2 ratio was introduced in paragraph 0078 and named in Table 1 as the "similarity ambiguity ratio". It was observed that the addition of this metric as a confidence estimate produced greater than one order of magnitude of improvement in the rate of undetected flow sample faults without a significant increase in the rate of "fault-detection faults". An order of magnitude improvement, however, is not required; other significant improvements include, for example, improvements of at least 10%, 50%, 100%, 200%, and 500%. In other words, this metric allowed the flow sample fault filter 59 to throw out nearly all flow sample faults without discarding a significant number of valid flow samples, measured over the course of a 30 second flight video containing the source frames 69-70.

Even when the flow sample fault filter 59 applies what is qualitatively described as "loose" filtering, the resultant optical flow vector field visualization 72 shows that only one flow field fault remains in the entire two-frame sequence, while many valid flow samples are still present. In contrast, the KLT algorithm (without the fault-aware correntropy matched filter) was forced to discard all of its samples to achieve the same result on this image sequence. (This is why no result is shown for KLT; there was nothing left to show). Furthermore, if "strict" filtering is applied by the flow sample fault filter 59, then all flow sample faults are removed 73, and good flow data remains. No other optical flow algorithm in existence today is capable of achieving results even close to that achieved in this example by this embodiment of fault-aware correntropy optical flow for similar computer resource utilization.

The particular processing operations illustrated in FIGS. 2, 3, 4, 6, and 7 are merely examples and do not constitute limitations of the present invention. The same or similar results may be obtained in ways other than those shown in FIGS. 2, 3, 4, 6, and 7.

The techniques disclosed herein are particularly useful in conjunction with autonomous mission- and safety-critical embedded systems with strict reliability requirements. The greatest known benefit is gained when a system does not have a human in the loop to "correct" mistakes. Three examples of such systems are: (1) a vision-based sense-and-avoid subsystem of a small unmanned aerial vehicle (UAV); (2) an automated target identification/classification algorithm in a mine-hunting system, and (3) a traditional cellular communications system. These are merely examples, however, and do not constitute limitations of the present invention.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

The techniques described above may be implemented, for example, in hardware, software tangibly embodied in a computer-readable medium (such as in the form of non-transitory signals stored in the computer-readable medium), firmware, or any combination thereof. The techniques described above may be implemented in one or more computer programs executing on a programmable computer including a processor, a storage medium readable by the processor (including, for example, volatile and non-volatile memory and/or storage elements), at least one input device, and at least one output device. Program code may be applied to input entered using the input device to perform the functions described and to generate output. The output may be provided to one or more output devices.

Each computer program within the scope of the claims below may be implemented in any programming language, such as assembly language, machine language, a high-level procedural programming language, an object-oriented programming language, or a hardware definition language (HDL). The programming language may, for example, be a compiled or interpreted programming language.

Each such computer program may be implemented in a computer program product tangibly embodied in a machine-readable storage device for execution by a computer processor. Method steps of the invention may be performed by a computer processor executing a program tangibly embodied on a computer-readable medium to perform functions of the invention by operating on input and generating output. Suitable processors include, by way of example, both general and special purpose microprocessors. Generally, the processor receives instructions and data from a read-only memory and/or a random access memory. Storage devices suitable for tangibly embodying computer program instructions include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits) or FPGAs (Field-Programmable Gate Arrays). A computer can generally also receive programs and data from a storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

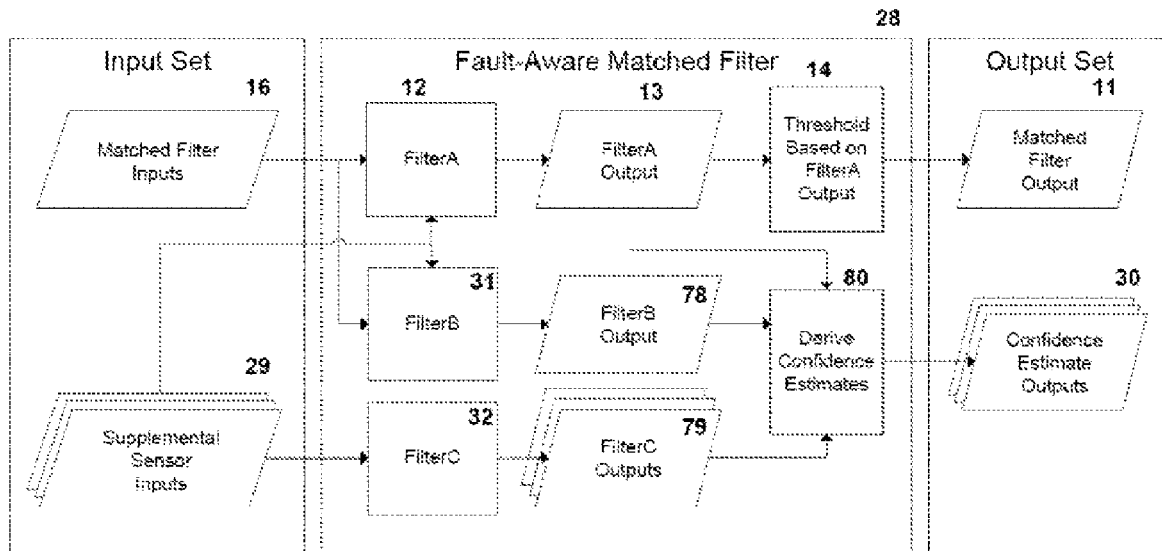

What is claimed is:

1. A method performed by at least one computer processor, the method comprising:
   (A) receiving a first image input in an image input sequence;
   (B) receiving a second image input in the image input sequence, wherein the second image input has a relative position subsequent to the first image input in the image input sequence;
   (C) at the at least one computer processor, applying a frame sample filter to the first image input to produce a sample pattern comprising at least one sample;
   (D) at the at least one computer processor, applying a sample registration filter to the second image input and the sample pattern to identify:
      (1) an unfiltered flow sample set comprising at least one optical flow sample, wherein the unfiltered flow sample set defines a coregistration between the first image input and the second image input;
      (2) at least one fault warning representing a degree of confidence in the coregistration;
   (E) at the at least one computer processor, removing, from the unfiltered flow sample set, at least one sample specified by the at least one fault warning as in-fault, to produce a filtered flow sample set; and
   (F) at the at least one computer processor, generating optical flow confidence estimate output based on the filtered flow sample set.

2. The method of claim 1, wherein (F) comprises generating the optical flow confidence estimate output based on the filtered flow sample set and at least one of: (1) a third input not contained within the first image input or the second image input; (2) the sample pattern; and (3) the at least one fault warning.

3. The method of claim 1, wherein (F) comprises generating the optical flow confidence estimate output based on the filtered flow sample set and the third input.

4. The method of claim 1, wherein (C) comprises applying a matched filter to the first image input to produce the sample pattern.

5. The method of claim 1, wherein (D) comprises applying a matched filter to the second image input and the sample pattern to identify the unfiltered flow sample and the at least one fault warning.

6. The method of claim 1, wherein (C) comprises applying the frame sample filter to the first image input and the third input to produce the sample pattern.

7. The method of claim 1, wherein (E) comprises determining which of the samples in the unfiltered flow sample set to remove from the unfiltered flow sample set based on the third input and the at least one fault warning.

8. The method of claim 1, wherein the first matched filter comprises a correntropy matched filter.

9. The method of claim 1, wherein the second matched filter comprises a correntropy matched filter.

10. A system comprising:
means for receiving a first image input in an image input sequence;
means for receiving a second image input in the image input sequence, wherein the second image input has a relative position subsequent to the first image input in the image input sequence;
a frame sample filter comprising means for producing, based on the first image input, a sample pattern comprising at least one sample;
a sample registration filter comprising means for identifying, based on the second image input and the sample pattern:
(1) an unfiltered flow sample set comprising at least one optical flow sample, wherein the unfiltered flow sample set defines a coregistration between the first image input and the second image input;
(2) at least one fault warning representing a degree of confidence in the coregistration;
a flow sample fault filter comprising means for removing, from the unfiltered flow sample set, at least one sample specified by the at least one fault warning as in-fault, to produce a filtered flow sample set; and
an optical flow confidence estimate generator to generate optical flow confidence estimate output based on the filtered flow sample set.

11. The system of claim 10, wherein the optical flow confidence estimate generator comprises means for generating the optical flow confidence estimate output based on the filtered flow sample set and at least one of: (1) a third input not contained within the first image input or the second image input; (2) the sample pattern; and (3) the at least one fault warning.

12. The system of claim 11, wherein the optical flow confidence estimate generator comprises means for generating the optical flow confidence estimate output based on the filtered flow sample set and the third input.

13. The system of claim 10, wherein the frame sample filter comprises a matched filter.

14. The system of claim 10, wherein the sample registration filter comprises a matched filter.

15. The system of claim 10, wherein the frame sample filter comprises means for producing the sample pattern based on the first image input and the third input.

16. The system of claim 10, wherein the flow sample fault filter comprises means for determining which of the samples in the unfiltered flow sample set to remove from the unfiltered flow sample set based on the third input and the at least one fault warning.

17. The system of claim 10, wherein the first matched filter comprises a correntropy matched filter.

18. The system of claim 10, wherein the second matched filter comprises a correntropy matched filter.

19. A method performed by at least one computer processor, the method comprising:
(A) receiving a first image input in an image input sequence;
(B) receiving a second image input in the image input sequence, wherein the second image input has a relative position subsequent to the first image input in the image input sequence;
(C) at the at least one computer processor, applying a frame sample filter, including a first matched filter, to the first image input to produce a sample pattern comprising at least one sample;
(D) at the at least one computer processor, applying a sample registration filter, including a second matched filter, to the second image input and the sample pattern to identify:
(1) an unfiltered flow sample set comprising at least one optical flow sample, wherein the unfiltered flow sample set defines a coregistration between the first image input and the second image input; and
(2) at least one fault warning representing a degree of confidence in the coregistration; and
(E) at the at least one computer processor, removing, from the unfiltered flow sample set, at least one sample specified by the at least one fault warning as in-fault, to produce a filtered flow sample set.

20. The method of claim 19, further comprising:
(F) generating optical flow confidence estimate output based on the filtered flow sample set and at least one of:
(1) a third input not contained within the first image input or the second image input; (2) the sample pattern; and (3) the at least one fault warning.

21. The method of claim 19, wherein (C) comprises applying the frame sample filter to the first image input and the third input to produce the sample pattern.

22. The method of claim 19, wherein (E) comprises determining which of the samples in the unfiltered flow sample set to remove from the unfiltered flow sample set based on the third input and the at least one fault warning.

23. The method of claim 19, wherein the first matched filter comprises a correntropy matched filter.

24. The method of claim 19, wherein the second matched filter comprises a correntropy matched filter.

25. A system comprising:
means for receiving a first image input in an image input sequence;
means for receiving a second image input in the image input sequence, wherein the second image input has a relative position subsequent to the first image input in the image input sequence;
a frame sample filter comprising a first matched filter, the matched filter comprising means for producing, based on the first image input, a sample pattern comprising at least one sample;
a sample registration filter comprising means for identifying, based on the second image input and the sample pattern:
(1) an unfiltered flow sample set comprising at least one optical flow sample, wherein the unfiltered flow sample set defines a coregistration between the first image input and the second image input; and
(2) at least one fault warning representing a degree of confidence in the coregistration; and
a flow sample fault filter comprising means for removing, from the unfiltered flow sample set, at least one sample specified by the at least one fault warning as in-fault, to produce a filtered flow sample set.

26. The method of claim 25, further comprising:
an optical flow confidence estimate generator to generate optical flow confidence estimate output based on the filtered flow sample set and at least one of: (1) a third input not contained within the first image input or the second image input; (2) the sample pattern; and (3) the at least one fault warning.

27. The system of claim 25, wherein the frame sample filter comprises means for producing the sample pattern based on the first image input and the third input.

28. The system of claim 25, wherein the flow sample filter comprises means for determining which of the samples in the unfiltered flow sample set to remove from the unfiltered flow sample set based on the third input and the at least one fault warning.

29. The system of claim 25, wherein the first matched filter comprises a correntropy matched filter.

30. The system of claim 25, wherein the second matched filter comprises a correntropy matched filter.

* * * * *

UNITED STATES PATENT AND TRADEMARK OFFICE
CERTIFICATE OF CORRECTION

PATENT NO. : 9,536,174 B2
APPLICATION NO. : 14/640789
DATED : January 3, 2017
INVENTOR(S) : Walter Lee Hunt, Jr.

It is certified that error appears in the above-identified patent and that said Letters Patent is hereby corrected as shown below:

On the Title Page

Delete the title page and replace with the attached title page showing the corrected figure.

Signed and Sealed this
Eighteenth Day of April, 2017

Michelle K. Lee
*Director of the United States Patent and Trademark Office* ness in the accuracy of the fault-aware matched filter

CERTIFICATE OF CORRECTION (continued)

(12) United States Patent
Hunt, Jr.

(10) Patent No.: US 9,536,174 B2
(45) Date of Patent: Jan. 3, 2017

(54) FAULT-AWARE MATCHED FILTER AND OPTICAL FLOW

(71) Applicant: Prioria Robotics, Inc., Gainesville, FL (US)

(72) Inventor: Walter Lee Hunt, Jr., Gainesville, FL (US)

(73) Assignee: Prioria Robotics, Inc., Gainesville, FL (US)

(*) Notice: Subject to any disclaimer, the term of this patent is extended or adjusted under 35 U.S.C. 154(b) by 0 days.

(21) Appl. No.: 14/640,789

(22) Filed: Mar. 6, 2015

(65) Prior Publication Data
US 2015/0186750 A1 Jul. 2, 2015
US 2016/0247041 A2 Aug. 25, 2016

Related U.S. Application Data

(62) Division of application No. 12/789,144, filed on May 27, 2010, now Pat. No. 8,977,665.

(60) Provisional application No. 61/182,098, filed on May 28, 2009, provisional application No. 61/181,664, filed on May 27, 2009.

(51) Int. Cl.
| G06K 9/64 | (2006.01) |
| G06K 9/62 | (2006.01) |
| G06T 7/20 | (2006.01) |
| H03H 17/02 | (2006.01) |
| G06K 9/03 | (2006.01) |

(52) U.S. Cl.
CPC ............ G06K 9/6201 (2013.01); G06K 9/03 (2013.01); G06T 7/20 (2013.01); H03H 17/0248 (2013.01); *G06T 2207/10016* (2013.01); *H03H 17/0254* (2013.01)

(58) Field of Classification Search
CPC .......... G06K 9/6201; G06K 9/03; G06T 7/20; H03H 17/0248; H03H 17/02
USPC ...................................................... 382/217
See application file for complete search history.

(56) References Cited

U.S. PATENT DOCUMENTS

2002/0148961 A1* 10/2002 Nakasuji ............ G01N 23/225
                                                              250/311
2004/0170326 A1*  9/2004 Kataoka ............. G06T 7/0044
                                                               382/209

* cited by examiner

*Primary Examiner* — Ruiping Li
(74) *Attorney, Agent, or Firm* — Robert Plotkin, P.C.; Robert Plotkin, Esq.

(57) ABSTRACT

In one embodiment, a fault-aware matched filter augments the output of a component matched filter to provide both fault-aware matched filter output and a measure of confidence in the accuracy of the fault-aware matched filter output. In another embodiment, an optical flow engine derives, from a plurality of images, both optical flow output and a measure of confidence in the optical flow output. The measure of confidence may be derived using a fault-aware matched filter.

30 Claims, 13 Drawing Sheets